US008879264B2

(12) United States Patent
Tsai

(10) Patent No.: US 8,879,264 B2
(45) Date of Patent: Nov. 4, 2014

(54) STACKED HEAT DISSIPATING MODULE OF AN ELECTRONIC DEVICE

(71) Applicant: Gemtek Technology Co., Ltd, Hukou Township (TW)

(72) Inventor: Yu-Jen Tsai, Hukou Township (TW)

(73) Assignee: Gemtek Technology Co., Ltd. (TW)

( * ) Notice: Subject to any disclaimer, the term of this patent is extended or adjusted under 35 U.S.C. 154(b) by 217 days.

(21) Appl. No.: 13/644,776

(22) Filed: Oct. 4, 2012

(65) Prior Publication Data

US 2013/0301222 A1 Nov. 14, 2013

(30) Foreign Application Priority Data

May 9, 2012 (TW) .............................. 101208717 A

(51) Int. Cl.
*H05K 7/20* (2006.01)
*G06F 1/20* (2006.01)

(52) U.S. Cl.
USPC ........ 361/711; 361/679.54; 361/704; 361/75; 361/719; 257/707; 257/713; 257/719; 165/80.2; 165/80.3; 165/104.33; 174/16.3; 174/252

(58) Field of Classification Search
USPC ............... 361/679.46, 679.54, 702, 704–712, 361/715, 719, 720–724, 756, 758, 760, 785, 361/790; 165/80.2–80.5, 104.33, 185; 257/706–727, 686, 698; 174/15.1, 174/16.3, 252; 29/825–852
See application file for complete search history.

(56) References Cited

U.S. PATENT DOCUMENTS

| 6,252,774 | B1 * | 6/2001 | Rife ............................. 361/704 |
| 7,290,596 | B2 * | 11/2007 | Yang et al. .................... 165/146 |
| 7,298,622 | B2 * | 11/2007 | Conner et al. ................ 361/710 |
| 7,400,506 | B2 * | 7/2008 | Hoss et al. .................... 361/715 |
| 7,462,934 | B2 * | 12/2008 | Reents .......................... 257/719 |
| 7,492,598 | B2 * | 2/2009 | Narasimhan et al. ......... 361/719 |
| 7,719,842 | B2 * | 5/2010 | Kreissig et al. .............. 361/719 |
| 7,990,719 | B2 * | 8/2011 | Chen et al. .................... 361/719 |

* cited by examiner

*Primary Examiner* — Michail V Datskovskiy
(74) *Attorney, Agent, or Firm* — Hershkovitz & Associates, PLLC; Abraham Hershkovitz

(57) ABSTRACT

A stacked heat dissipating module of an electronic device has a holding frame, and at least one first heat conducting medium layer, a heat dissipating medium layer, a first heat sink layer, at least one second heat conducting medium layer and at least one second heat sink layer stacked with each other. The at least one first heat conducting medium layer is mounted on at least one heating component of the electronic device to dissipate heat generated from the at least one heating component. Moreover, the holding frame, the heat conducting medium layers and the heat sink layers have corresponding housing holes for exposing an exposed component of the electronic device to bring the exposed component's function into full play.

20 Claims, 4 Drawing Sheets

STACKED HEAT DISSIPATING MODULE OF AN ELECTRONIC DEVICE

BACKGROUND OF THE INVENTION

1. Field of the Invention

The present invention relates to a stacked heat dissipating module of an electronic device that dissipates heat inside the electronic device with stacked heat conducting mediums and heat sinks.

2. Description of the Prior Art(s)

With reference to FIG. 4, a conventional electronic device 70 has a circuit board 71, multiple electronic components 72 and a metal heat sink 73. The electronic components 72 are mounted on the circuit board 71. The heat sink 73 is disposed above the electronic components 72. A heat conducting medium, such as a thermal pad, thermal grease or the like, is mounted or filled between the electronic components 72 and the heat sink 73. Thus, the heat conducting medium and the heat sink 73 dissipate heat generated from the electronic components 72, so the conventional electronic device 70 stays in temperatures that allow the conventional electronic device 70 to operate properly.

However, with development of electronic industry, electronic devices are designed to have various functions. Consequently, electronic components and spatial arrangement inside the electronic device are getting more and more complicated. Although mounting the single and intact heat sink 73 on the electronic components 72 causes the electronic components 72, such as light emitting components, signal emitting components or signal receiving components and so on, to be ineffective, omitting the heat sink 73 makes the conventional electronic device 70 too hot to work.

To overcome the shortcomings, the present invention provides a stacked heat dissipating module of an electronic device to mitigate or obviate the aforementioned problems.

SUMMARY OF THE INVENTION

The main objective of the present invention is to provide a stacked heat dissipating module of an electronic device. The stacked heat dissipating module has a holding frame, and at least one first heat conducting medium layer, a heat dissipating medium layer, a first heat sink layer, at least one second heat conducting medium layer and at least one second heat sink layer stacked with each other.

The at least one first heat conducting medium layer is mounted on at least one heating component of the electronic device to dissipate heat generated from the at least one heating component. Moreover, the holding frame, the heat conducting medium layers and the heat sink layers have corresponding housing holes for exposing an exposed component of the electronic device to bring the function of the exposed component into full play.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
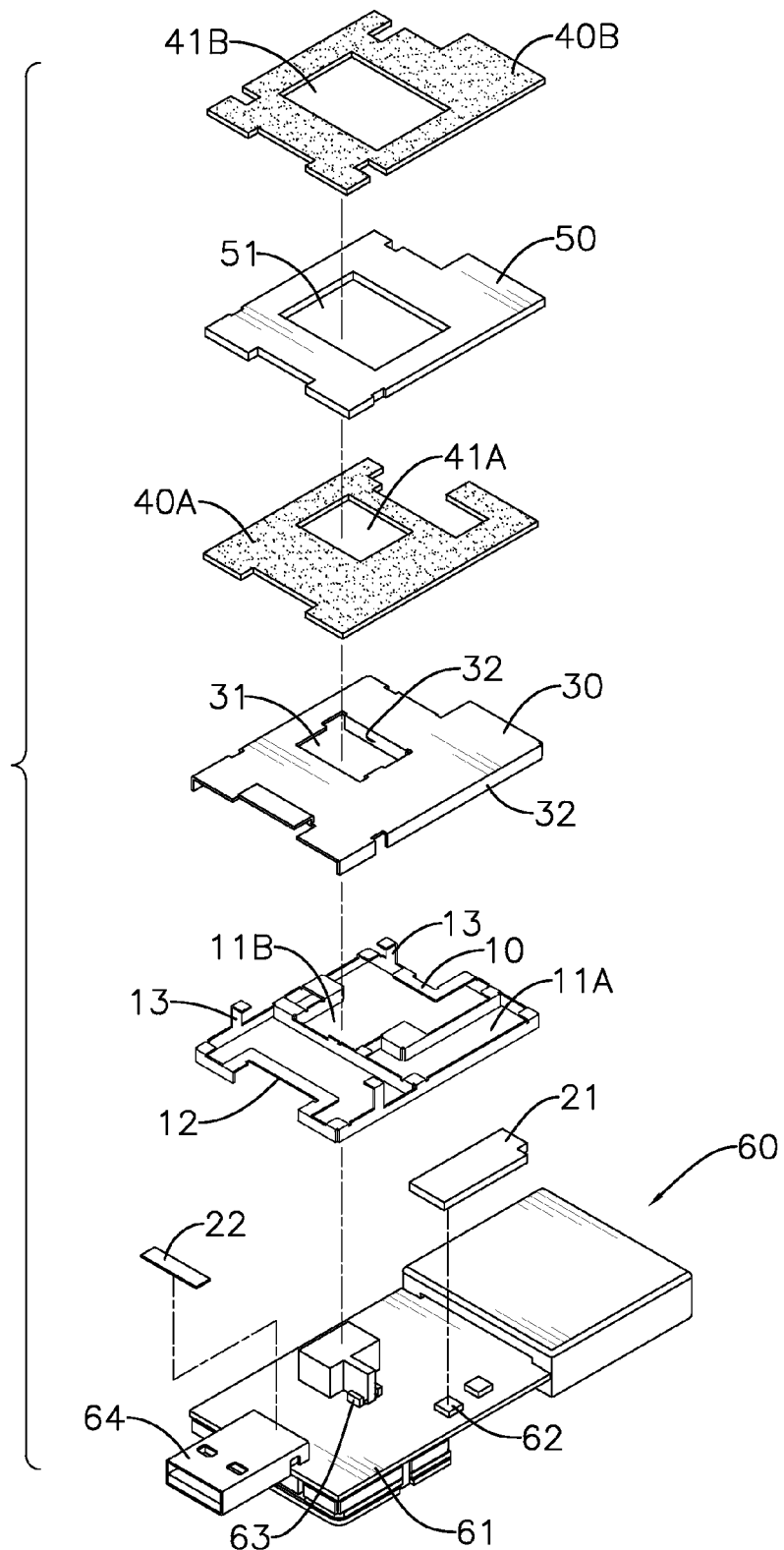
FIG. 1 is an exploded perspective view of a stacked heat dissipating module of an electronic device in accordance with the present invention.

With reference to FIG. 1, a stacked heat dissipating module in accordance with the present invention is mounted in an electronic device 60. The electronic device 60 has a circuit board 61, at least one heating component 62, an exposed component 63 and a connector 64. The at least one heating component 62 and the exposed component 63 are mounted on the circuit board 61. The exposed component 63 may be a light emitting component, a signal receiving component or a signal emitting component. The connector 64 is mounted on a side edge of the circuit board 61, and may be a universal serial bus (USB) connector or other standard connectors.

The stacked heat dissipating module is mounted on a top surface of the circuit board 61 and comprises a holding frame 10, at least one first heat conducting medium layer 21, a heat dissipating medium layer 22, a first heat sink layer 30, at least one second heat conducting medium layer 40A, 40B and at least one second heat sink layer 50.

The holding frame 10 is mounted on the top surface of the circuit board 61 and has multiple housing holes 11A, 11B and a mounting recess 12. The housing holes 11A, 11B of the holding frame 10 are formed through the holding frame 10 for the at least one heating component 62 and the exposed component 63 of the electronic device 60 to protrude through the housing holes 11A, 11B of the holding frame 10. The mounting recess 12 is formed in a sidewall of the holding frame 10 for the connector 64 of the electronic device 60 to be mounted in the mounting recess 12 of the holding frame 10.

Figure 2:
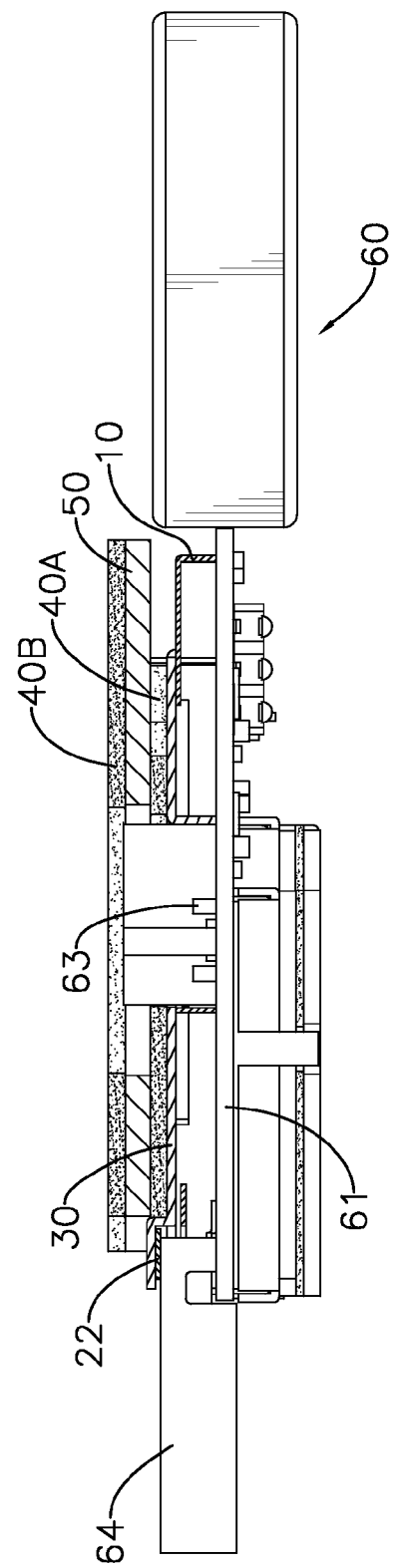
FIG. 2 is a partial side view in partial section of the stacked heat dissipating module of the electronic device in FIG. 1.

With further reference to FIG. 2, the at least one first heat conducting medium layer 21 is mounted on the at least one heating component 62. Each one of the at least one first heat conducting medium layer 21 may be a thermal pad or thermal grease. The heat dissipating medium layer 22 is mounted on the connector 64 of the electronic device 60.

Figure 3:
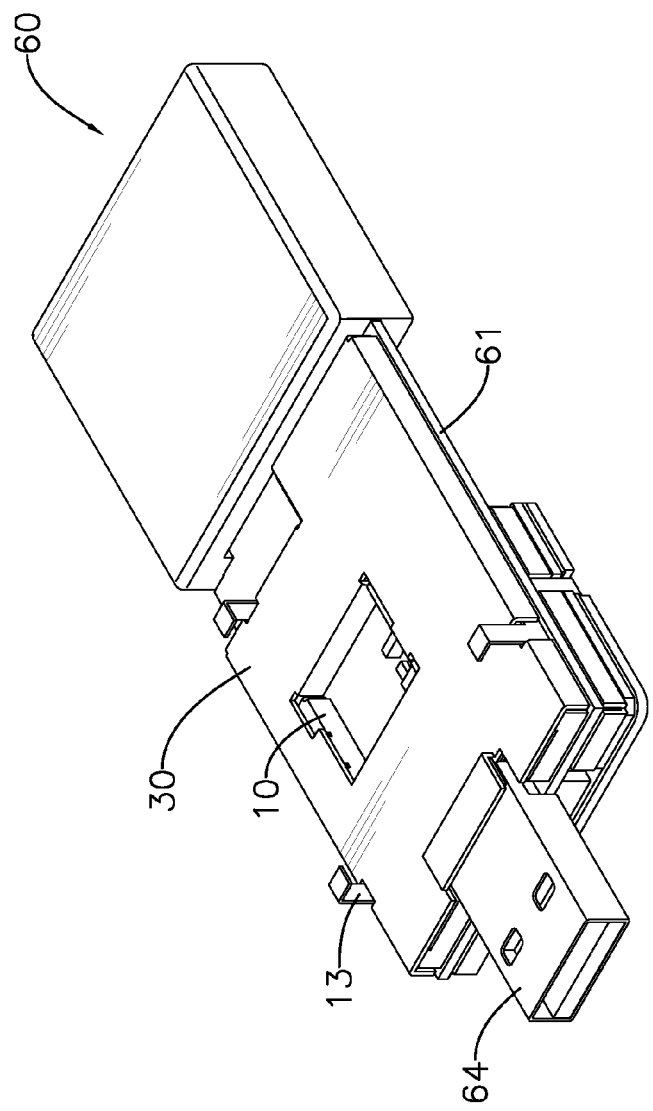
FIG. 3 is a partial perspective view of the stacked heat dissipating module of the electronic device in FIG. 1.
Figure 4:
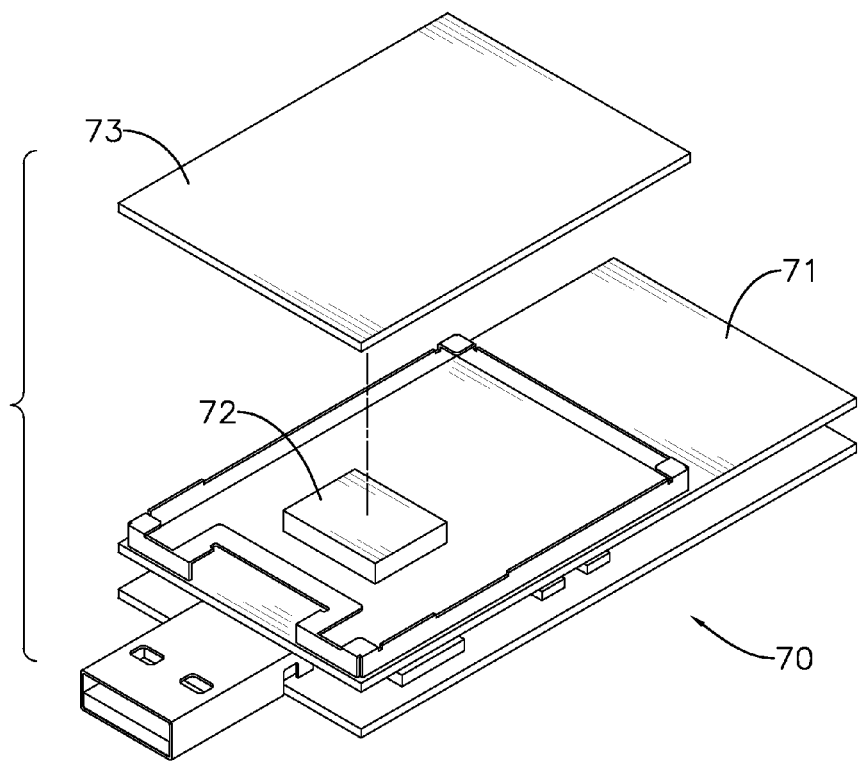
FIG. 4 is an exploded perspective view of a conventional electronic device in accordance with the prior art.

With further reference to FIG. 3, the first heat sink layer 30 is metallic, is mounted on and is attached to the at least one first heat conducting medium layer 21 and the heat dissipating medium layer 22, and has an outer peripheral edge, a housing hole 31, an inner peripheral edge and multiple shielding panels 32. The housing hole 31 of the first heat sink layer 30 is formed through the first heat sink layer 30 for exposing the exposed component 63. The inner peripheral edge of the first heat sink layer 30 is defined around the housing hole 31 of the first heat sink layer 30. The shielding panels 32 are formed on the outer peripheral edge and the inner peripheral edge of the first heat sink layer 30, are bent relative to the first heat sink layer 30 to shield electronic components, such as the at least one heating component 62, the exposed component 63 and so on, that are disposed on the circuit board 61.

The at least one second heat conducting medium layer 40A, 40B is mounted on the first heat sink layer 30. Each one of the at least one second heat conducting medium layer 40A, 40B may be a thermal pad or thermal grease and has a housing hole 41A, 41B. The housing hole 41A, 41B of the second heat conducting medium layer 40A, 40B is formed through the second heat conducting medium layer 40A, 40B and corresponds to the housing hole 31 of the first heat sink layer 30 for exposing the exposed component 63.

The at least one second heat sink layer 50 is metallic and is staggered with the at least one second heat conducting medium layer 40A, 40B. For instance, one of the at least one second heat conducting medium layer 40A is mounted on the first heat sink layer 30, one of the at least one second heat sink layer 50 is mounted on the second heat conducting medium layer 40A, and then the other one of the at least one second heat conducting medium layer 40B. The rest may be deduced by analogy. In the preferred embodiment, the stacked heat dissipating module has two second heat conducting medium layers 40A, 40B and one second heat sink layer 50. The second heat sink layer 50 is mounted between the two second heat conducting medium layers 40A, 40B. Each one of the at least one second heat sink layer 50 has a housing hole 51. The housing hole 51 of the second heat sink layer 50 is formed through the second heat sink layer 50 and corresponds to the housing hole 41A, 41B of the at least one second heat conducting medium layer 40A, 40B for exposing the exposed component 63.

Preferably, the holding frame 10 further has multiple holding arms 13. The holding arms 13 separately protrude from a peripheral edge of the holding frame 10, and hold the at least one first heat conducting medium layer 21, the heat dissipating medium layer 22, the first heat sink layer 30, the at least one second heat conducting medium layer 40A, 40B and the at least one second heat sink layer 50. In the preferred embodiment, each of the holding arms 13 protrudes up from the peripheral edge of the holding frame 10 and then bends sideward.

After the stacked heat dissipating module is set on the circuit board 61, a cover is further mounted on and contacts the stacked heat dissipating module. When the electronic device 60 operates, heat generated from the at least one heating component 62 is conducted to the at least one first heat conducting medium layer 21, the first heat sink layer 30, the at least one second heat conducting medium layer 40A, 40B and the at least one second heat sink layer 50, and is eventually dissipated from the cover of the electronic device 60. Moreover, the heat generated from the at least one heating component 62 is also conducted to the at least one first heat conducting medium layer 21, the first heat sink layer 30 and the heat dissipating medium layer 22, and is dissipated from the connector 64 of the electronic device 60.

The stacked heat dissipating module shields the electronic components inside the electronic device 60 and makes good use of interior of the electronic device 60 to dissipate heat generated from the at least one heating component 62. Furthermore, since the exposed component 63 is exposed from the housing holes 11A, 11B, 31, 41A, 41B, 51 of the holding frame 10, the heat conducting medium layers 21, 40A, 40B, the heat dissipating medium layer 22 and the heat sink layers 30, 50, the function of the exposed component 63 is brought into full play.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A stacked heat dissipating module of an electronic device comprising:
    at least one first heat conducting medium layer adapted for being mounted on at least one heating component of the electronic device; and
    a first heat sink layer mounted on and attached to the at least one first heat conducting medium layer and having a housing hole formed through the first heat sink layer for exposing an exposed component of the electronic device.

2. The stacked heat dissipating module as claimed in claim 1 further comprising:
    at least one second heat conducting medium layer mounted on the first heat sink layer, and each one of the at least one second heat conducting medium layer having a housing hole formed through the second heat conducting medium layer and corresponding to the housing hole of the first heat sink layer; and
    at least one second heat sink layer staggered with the at least one second heat conducting medium layer, and each one of the at least one second heat sink layer having a housing hole formed through the second heat sink layer and corresponding to the housing hole of the at least one second heat conducting medium layer.

3. The stacked heat dissipating module as claimed in claim 2 further comprising a heat dissipating medium layer adapted for being mounted on a connector of the electronic device; and
    the first heat sink layer further mounted on and attached to the heat dissipating medium layer.

4. The stacked heat dissipating module as claimed in claim 3 further comprising a holding frame having:
    multiple housing holes formed through the holding frame and adapted for the at least one heating component and the exposed component of the electronic device to protrude through the housing holes of the holding frame; and
    multiple holding arms separately protruding from a peripheral edge of the holding frame and holding the at least one first heat conducting medium layer, the heat dissipating medium layer, the first heat sink layer, the at least one second heat conducting medium layer and the at least one second heat sink layer.

5. The stacked heat dissipating module as claimed in claim 4, wherein the holding frame further has a mounting recess formed in a sidewall of the holding frame and adapted for the connector of the electronic device to be mounted in the recess of the holding frame.

6. The stacked heat dissipating module as claimed in claim 1, wherein the first heat sink layer further has
    an outer peripheral edge;
    an inner peripheral edge defined around the housing hole of the first heat sink layer; and
    multiple shielding panels formed on the outer peripheral edge and the inner peripheral edge of the first heat sink layer and bent relatively to the first heat sink layer.

7. The stacked heat dissipating module as claimed in claim 2, wherein the first heat sink layer further has
    an outer peripheral edge;
    an inner peripheral edge defined around the housing hole of the first heat sink layer; and
    multiple shielding panels formed on the outer peripheral edge and the inner peripheral edge of the first heat sink layer and bent relatively to the first heat sink layer.

8. The stacked heat dissipating module as claimed in claim 3, wherein the first heat sink layer further has
    an outer peripheral edge;
    an inner peripheral edge defined around the housing hole of the first heat sink layer; and
    multiple shielding panels formed on the outer peripheral edge and the inner peripheral edge of the first heat sink layer and bent relatively to the first heat sink layer.

9. The stacked heat dissipating module as claimed in claim 4, wherein the first heat sink layer further has
an outer peripheral edge;
an inner peripheral edge defined around the housing hole of the first heat sink layer; and
multiple shielding panels formed on the outer peripheral edge and the inner peripheral edge of the first heat sink layer and bent relatively to the first heat sink layer.

10. The stacked heat dissipating module as claimed in claim 5, wherein the first heat sink layer further has
an outer peripheral edge;
an inner peripheral edge defined around the housing hole of the first heat sink layer; and
multiple shielding panels formed on the outer peripheral edge and the inner peripheral edge of the first heat sink layer and bent relatively to the first heat sink layer.

11. The stacked heat dissipating module as claimed in claim 3, wherein
the at least one heat conducting medium layer, the heat dissipating medium layer and the second heat conducting medium layer are thermal pads or thermal grease; and
the first heat sink layer and the second heat sink layer are metallic.

12. The stacked heat dissipating module as claimed in claim 4, wherein
the at least one heat conducting medium layer, the heat dissipating medium layer and the second heat conducting medium layer are thermal pads or thermal grease; and
the first heat sink layer and the second heat sink layer are metallic.

13. The stacked heat dissipating module as claimed in claim 5, wherein
the at least one heat conducting medium layer, the heat dissipating medium layer and the second heat conducting medium layer are thermal pads or thermal grease; and
the first heat sink layer and the second heat sink layer are metallic.

14. The stacked heat dissipating module as claimed in claim 8, wherein
the at least one heat conducting medium layer, the heat dissipating medium layer and the second heat conducting medium layer are thermal pads or thermal grease; and
the first heat sink layer and the second heat sink layer are metallic.

15. The stacked heat dissipating module as claimed in claim 9, wherein
the at least one heat conducting medium layer, the heat dissipating medium layer and the second heat conducting medium layer are thermal pads or thermal grease; and
the first heat sink layer and the second heat sink layer are metallic.

16. The stacked heat dissipating module as claimed in claim 10, wherein
the at least one heat conducting medium layer, the heat dissipating medium layer and the second heat conducting medium layer are thermal pads or thermal grease; and
the first heat sink layer and the second heat sink layer are metallic.

17. The stacked heat dissipating module as claimed in claim 2 having:
two second heat conducting medium layers; and
one second heat sink layer mounted between the two second heat conducting medium layers.

18. The stacked heat dissipating module as claimed in claim 3 having:
two second heat conducting medium layers; and
one second heat sink layer mounted between the two second heat conducting medium layers.

19. The stacked heat dissipating module as claimed in claim 4 having:
two second heat conducting medium layers; and
one second heat sink layer mounted between the two second heat conducting medium layers.

20. The stacked heat dissipating module as claimed in claim 5 having:
two second heat conducting medium layers; and
one second heat sink layer mounted between the two second heat conducting medium layers.

* * * * *